(12) United States Patent
He et al.

(10) Patent No.: US 10,205,057 B2
(45) Date of Patent: Feb. 12, 2019

(54) FLIP-CHIP LIGHT EMITTING DIODE AND FABRICATION METHOD

(71) Applicant: XIAMEN SANAN OPTOELECTRONICS TECHNOLOGY CO., LTD., Xiamen (CN)

(72) Inventors: Anhe He, Xiamen (CN); Su-hui Lin, Xiamen (CN); Jiansen Zheng, Xiamen (CN); Kang-wei Peng, Xiamen (CN); Xiaoxiong Lin, Xiamen (CN); Chen-ke Hsu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/846,146

(22) Filed: Dec. 18, 2017

(65) Prior Publication Data

US 2018/0108810 A1    Apr. 19, 2018

Related U.S. Application Data

(63) Continuation of application No. PCT/CN2016/097756, filed on Sep. 1, 2016.

(30) Foreign Application Priority Data

Sep. 28, 2015    (CN) .......................... 2015 1 0625578

(51) Int. Cl.
*H01L 33/60*  (2010.01)
*H01L 33/38*  (2010.01)
(Continued)

(52) U.S. Cl.
CPC ............ *H01L 33/38* (2013.01); *H01L 33/005* (2013.01); *H01L 33/12* (2013.01); *H01L 33/60* (2013.01);
(Continued)

(58) Field of Classification Search
CPC ....... H01L 33/00; H01L 33/005; H01L 33/12; H01L 33/38; H01L 33/46; H01L 33/60; H01L 2933/0016; H01L 2933/0058
(Continued)

(56) References Cited

U.S. PATENT DOCUMENTS 9,024,351 B2 * 5/2015 Tu ........................... H01L 33/44
                                                         257/98

FOREIGN PATENT DOCUMENTS

CN          102437063 A        5/2012
CN          103682012 A        3/2014

* cited by examiner

*Primary Examiner* — Monica D Harrison
(74) *Attorney, Agent, or Firm* — Syncoda LLC; Feng Ma; Junjie Feng

(57) ABSTRACT

A flip-chip light-emitting diode structure includes a substrate; an epitaxial layer over the substrate, which includes a first semiconductor layer, a light-emitting layer, and a second semiconductor layer; a first electrode structure over the first semiconductor layer; a second electrode structure over the second semiconductor layer; wherein, the first electrode structure includes a first electrode body and a first electrode ring; the second electrode structure includes a second electrode body and a second electrode ring; the thickness of the first electrode ring is greater than or equal to that of the first electrode body and the thickness of the second electrode ring is greater than or equal to that of the second electrode body. As barrier structures, the first and the second electrode rings are used for avoiding short circuit
(Continued)

during packaging and usage of the light-emitting diode due to overflow of solid crystal conductive materials, thus improving reliability.

20 Claims, 11 Drawing Sheets

(51) Int. Cl.
*H01L 33/00* (2010.01)
*H01L 33/12* (2010.01)
*H01L 33/46* (2010.01)

(52) U.S. Cl.
CPC ...... *H01L 33/46* (2013.01); *H01L 2933/0016* (2013.01); *H01L 2933/0058* (2013.01)

(58) Field of Classification Search
USPC .......................................................... 257/98
See application file for complete search history.

FLIP-CHIP LIGHT EMITTING DIODE AND FABRICATION METHOD

CROSS-REFERENCE TO RELATED APPLICATIONS

The present application is a continuation of, and claims priority to, PCT/CN2016/097756 filed on Sep. 1, 2016, which claims priority to Chinese Patent Application No. 201510625578.0 filed on Sep. 28, 2015. The disclosures of these applications are hereby incorporated by reference in their entirety.

BACKGROUND

Light-emitting diodes (LEDs), due to long service life and low energy consumption, are applied in various fields. The III-V group compound semiconductors, represented by GaN, have huge application potential in optoelectronic device fields like high-brightness light-emitting diodes and lasers and attract widespread concerns, due to their wide band gap, high lighting efficiency, high electron saturation drift velocity and stable chemical property.

SUMMARY

The inventors of the present application have recognized that, at present, the flip-chip LED chip is often designed in rectangle shape and is a layered stack structure formed by a substrate, an epitaxial layer, a P-type ohmic contact layer (also reflective metal layer), an insulating layer and an N-type ohmic contact layer from bottom to up, wherein the metal layer is a large facet structure. Therefore, the design of the insulating layer is particularly important because any damage of the insulating layer may cause short-circuit of P and N metal electrodes; the insulating layer inside the chip is stable and not readily broken, but the insulating layer at the chip edge tends to be broken during chip backend process (such as grinding, cutting and sawing) or caused by stress. In addition, considering light-emitting efficiency and current distribution of the chip, the positions of the P and N metal electrodes are limited, which is in particular true for large size chip design. If solder paste welding is adopted in packaging, solder paste is likely to be distributed unevenly or overflow out of welding plate area. If the insulating layer at grain edge is damaged, it may cause poor circuit and electric leakage, as shown in FIGS. 1 and 2, thus influencing packaging yield and promotion application of flip-chip. Moreover, to fabricate a side-wall insulating layer, it is necessary to add dry etching process (such as ICP) or wet etching process during chip front-end processing. This etching process has high requirements of photo and etching technologies, which greatly increases chip manufacturing costs.

The present disclosure relates to the photoelectric and semiconductor technical field, and more particularly, to a flip-chip light-emitting diode and fabrication method thereof.

The technical problem to be solved by the present disclosure can therefore overcome defects of the prior art. A flip-chip light-emitting diode with improved reliability and fabrication method is provided, adopting electrodes as the barrier structure in chip design and fabrication process.

To solve the aforementioned technical problems, one technical scheme of the present disclosure provides a flip-chip light-emitting diode, which includes a substrate; an epitaxial structure over the substrate; wherein, the epitaxial structure includes a first semiconductor layer, a second semiconductor layer and a light-emitting layer between the first semiconductor layer and the second semiconductor layer; a first electrode structure over the first semiconductor layer; and a second electrode structure over the second semiconductor layer; wherein, the first electrode structure includes a first electrode body and a first electrode ring; the second electrode structure includes a second electrode body and a second electrode ring; a thickness of the first electrode ring is greater than or equal to a thickness of the first electrode body; and a thickness of the second electrode ring is greater than or equal to a thickness of the second electrode body.

In some embodiments of the present disclosure, the first electrode ring encircles the first electrode body and is spaced from the first electrode body; and the second electrode ring encircles the second electrode body and is spaced from the second electrode body.

In some embodiments, each of the first electrode ring and the second electrode ring has at least one circle.

In some embodiments, as barrier structures, the first electrode ring and the second electrode ring are used for avoiding short circuit during packaging and usage of the light-emitting diode due to overflow of solid crystal conductive materials, thus improving the reliability of the LEDs.

In some embodiments, the aforementioned flip-chip light-emitting diode structure may also include a reflective layer formed over the epitaxial layer before the formation of the first and the second electrode structures; wherein, the reflective layer can be a single metal layer or a composite metal layer.

In some embodiments, the aforementioned flip-chip light-emitting diode structure may also include a conductive layer formed over the epitaxial layer before the formation of the first and the second electrode structures; wherein, the conductive layer can be an ITO, ZnO, CTO, InO, In-doped ZnO or Al-doped ZnO or Ga-doped ZnO or any of their combinations.

To solve the above technical problems, another technical scheme of the present disclosure provides a fabrication method for a flip-chip light-emitting diode structure, including: 1) providing a substrate; 2) fabricating an epitaxial structure over the substrate; wherein, the epitaxial layer includes a first semiconductor layer, a second semiconductor layer and a light-emitting layer between the first semiconductor layer and the second semiconductor layer; 3) fabricating a first electrode structure over the first semiconductor layer; wherein, the first electrode structure includes a first electrode body and a first electrode ring; a thickness of the first electrode ring is greater than or equal to a thickness of the first electrode body; and 4) fabricating a second electrode structure over the second semiconductor layer; wherein, the second electrode structure includes a second electrode body and a second electrode ring; and a thickness of the second electrode ring is greater than or equal to a thickness of the second electrode body.

In some embodiments, the first electrode ring encircles the first electrode body and is spaced from the first electrode body; and the second electrode ring encircles the second electrode body and is spaced from the second electrode body.

In some embodiments, each of the first electrode ring and the second electrode ring has at least one circle.

In some embodiments, as barrier structures, the first electrode ring and the second electrode ring are used for avoiding short circuit during packaging and usage of the light-emitting diode due to overflow of solid crystal conductive materials, thus improving the reliability of the LEDs.

In some embodiments, the aforementioned fabrication method may also include fabricating a reflective layer over the epitaxial layer before the first and the second electrode structures are formed; wherein, the reflective layer can be a single metal layer or a composite metal layer, and the material can be Ag, Al, Ti, Ni or any of their combinations.

In some embodiments, the aforementioned fabrication method may also include fabricating a conductive layer over the epitaxial layer before the first and the second structures are formed; wherein, the conductive layer can be an ITO, ZnO, CTO, InO, In-doped ZnO or Al-doped ZnO or Ga-doped ZnO or any of their combinations.

In some embodiments, the substrate can be a growth substrate, a heat-dissipating substrate, a bonding substrate or any of their combinations.

In some embodiments, the growth substrate material can be sapphire ($Al_2O_3$), silicon carbide (SiC), gallium nitride (GaN) or any of their combinations.

In some embodiments, the first and the second electrode structure can be Ni/Au, Cr/Pt/Au, Ti/Al/Ti/Au or any of their combinations.

Compared with existing technologies, the present disclosure has at least the following advantages: a circular electrode is added in the electrode structure of the flip-chip light-emitting diode chip to serve as a barrier structure, which avoids short-circuit during packaging and usage of the chip due to overflow of solid crystal conductive materials, thus improving the reliability of the LEDs; in addition, the fabrication method provided in various embodiments of the present disclosure simplifies the fabrication process because no dry or wet etching process is needed to form a side-wall insulating layer, thus improving chip yield and reducing fabrication cost.

The other features and advantages of this present disclosure will be described in detail in the following specification, and it is believed that such features and advantages will become more apparent in the specification or through implementations of this disclosure. The purposes and other advantages of the present disclosure can be realized and obtained in the structures specifically described in the specifications, claims and drawings.

While the disclosure will be described in conjunction with exemplary embodiments and methods of use, it will be understood by those skilled in the art that such description is not intended to limit the scope of the present disclosure. Various alternations, modifications and equivalents may be made therein without departing from the spirit and scope of the disclosure as defined by the appended claims.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive. In addition, the drawings may not be drawn to scale.

Figure 1:
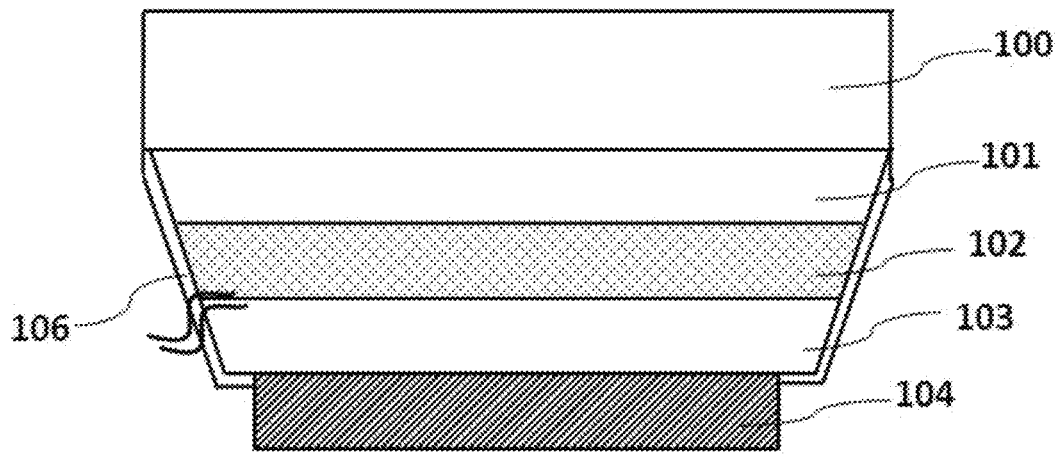
FIG. 1 illustrates a sectional view of an existing flip-chip light-emitting diode.
Figure 2:
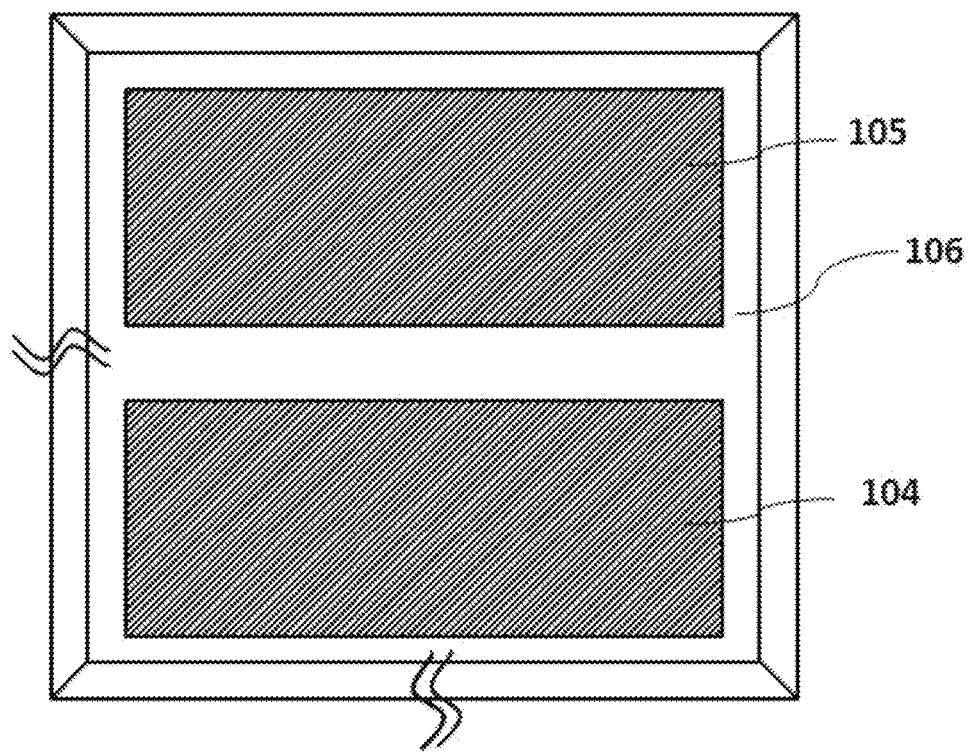
FIG. 2 illustrates a top view of an existing flip-chip light-emitting diode.

In the drawings: 100: growth substrate; 101: N-type layer; 102: light-emitting layer; 103: P-type layer; 104: P-type electrode; 1041: P-type electrode body; 1042: P-type electrode ring; 105: N-type electrode; 1051: N-type electrode body; 1052: N-type electrode ring; 106: insulating layer; 107: conductive layer; 108: reflective layer; 109: solder paste.

DETAILED DESCRIPTION

The embodiments of the present disclosure will be described in detail with reference to the accompanying drawings and examples, to help understand and practice the disclosed embodiments, regarding how to solve technical problems using technical approaches for achieving the technical effects. It should be understood that the embodiments and their characteristics described in this disclosure may be combined with each other and such technical proposals are deemed to be within the scope of this disclosure without departing from the spirit of this disclosure.

Embodiment 1

Figure 3:
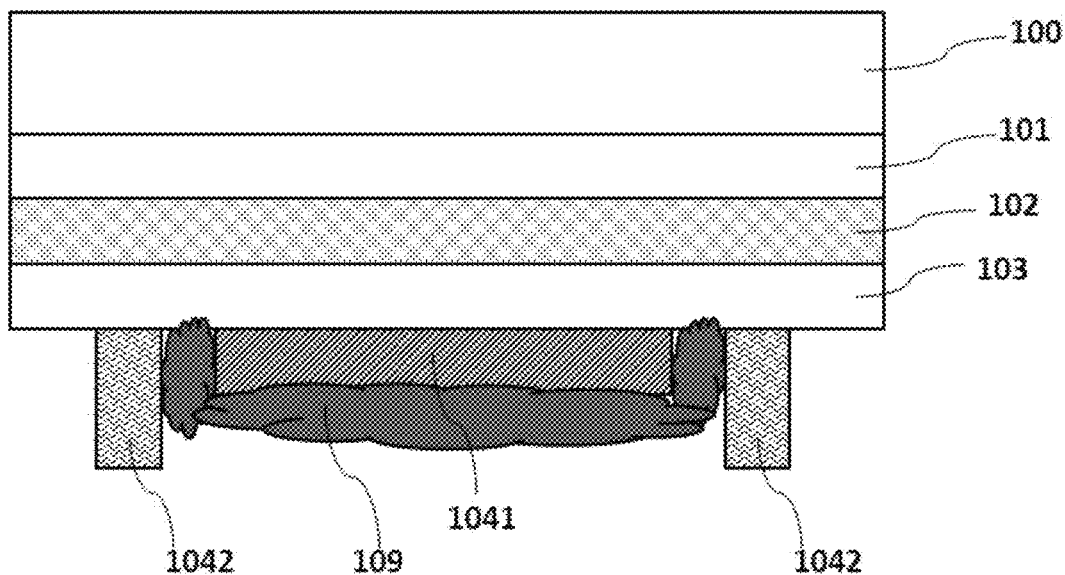
FIG. 3 illustrates a sectional view (along AA in FIG. 5) of the flip-chip light-emitting diode provided in Embodiment 1 of the present disclosure.
Figure 4:
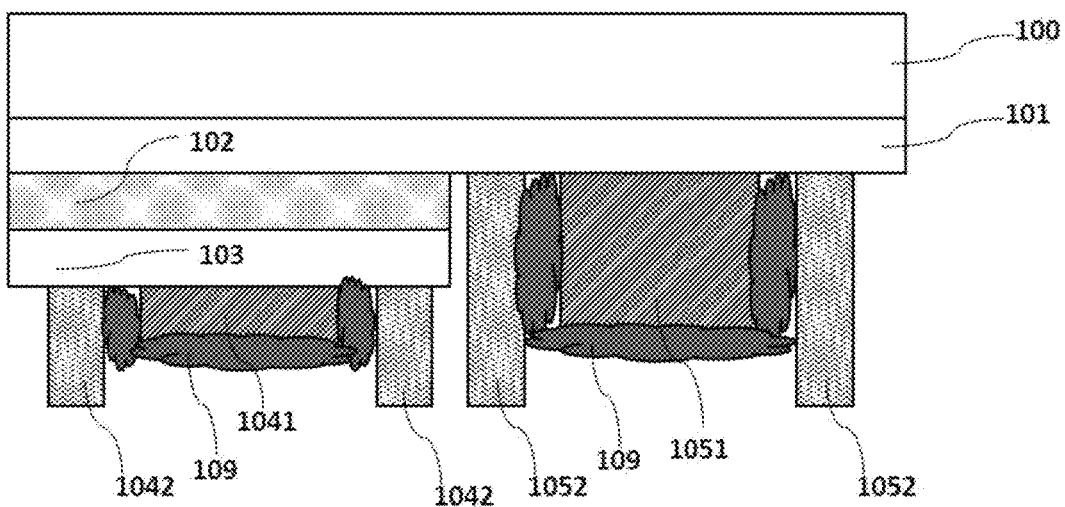
FIG. 4 illustrates a sectional view (along BB in FIG. 5) of the flip-chip light-emitting diode provided in Embodiment 1 of the present disclosure.
Figure 5:
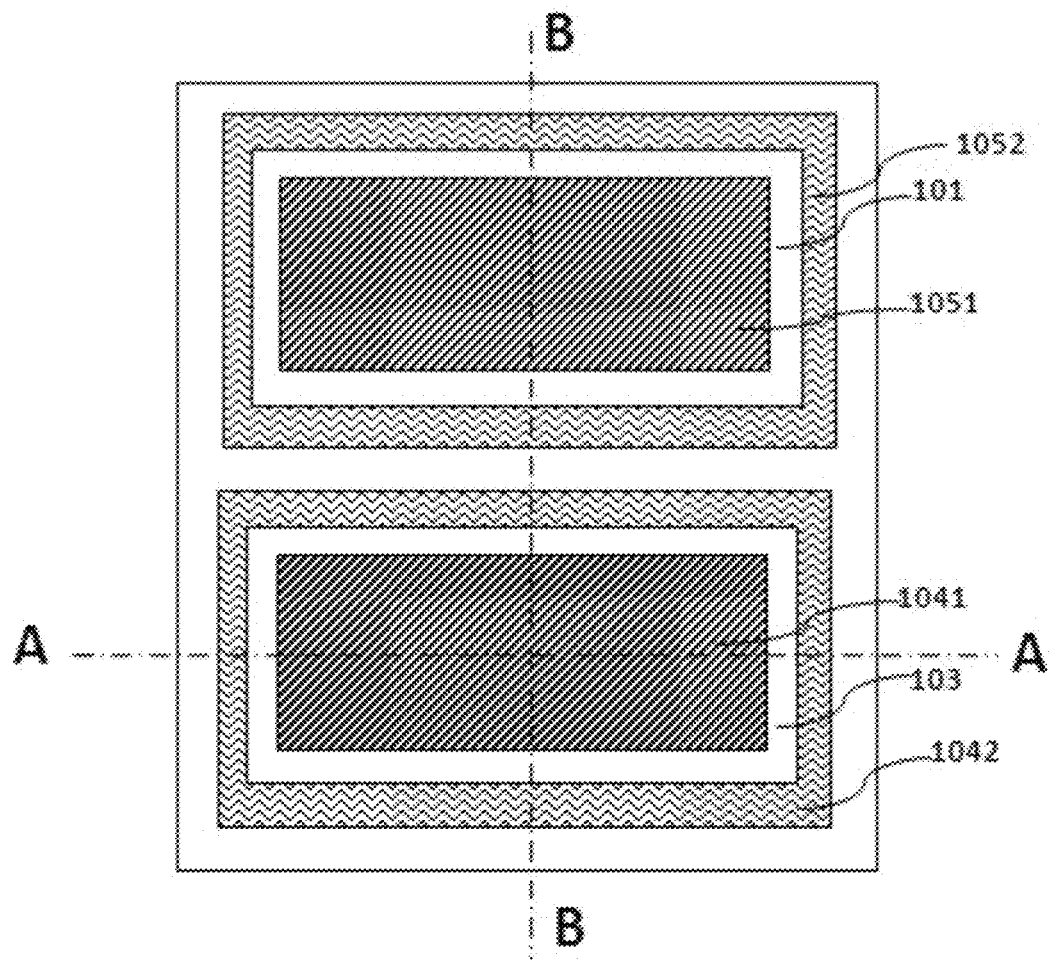
FIG. 5 illustrates a top view of the flip-chip light-emitting diode provided in Embodiment 1 of the present disclosure.

FIG. 3 illustrates a cross-sectional view of a flip-chip light-emitting diode along A-A direction as shown in FIG. 5. FIG. 4 illustrates a cross-sectional view of a flip-chip light-emitting diode along B-B direction as shown in FIG. 5. This embodiment provides a GaN-based flip-chip light-emitting diode, including a growth substrate 100, an N-type layer 101, a light-emitting layer 102, a P-type layer 103, a P-type electrode body 1041, a P-type electrode ring 1042, an N-type electrode body 1051 and an N-type electrode ring 1052.

Specifically, the growth substrate 100 in the GaN-based flip-chip light-emitting diode structure is a sapphire substrate; the epitaxial layer is formed over the light-emitting layer 102, wherein, the epitaxial layer includes the N-type layer 101, the light-emitting layer 102 and the P-type layer 103; the P-type electrode structure includes the P-type electrode body 1041 and the P-type electrode ring 1042 over the P-type layer 103; the N-type electrode structure includes the N-type electrode body 1051 and the N-type electrode ring 1052 over the N-type layer 101; wherein, a thickness of the P-type electrode ring 1042 is larger than or equal to a thickness of the P-type electrode body 1041 and a thickness of the N-type electrode ring 1052 is greater than or equal to a thickness of the N-type electrode body 1051. In some embodiments, the P-type electrode ring 1042 encircles and is spaced from the P-type electrode body 1041; and the N-type electrode ring 1052 encircles and is spaced from the N-type electrode body 1051; in this manner, the P-type electrode ring and the N-type electrode ring serve as a barrier structure, functioning like a "barrier wall". This increases the climbing difficulty of solid crystal conductive materials (such as solder paste 109), which avoids short circuit during packaging and usage of the light-emitting diode due to overflow of solder paste, thus improving the reliability and the yield of the flip-chip light-emitting diode chip.

Embodiment 2

FIGS. 6-13 show schematic diagrams of the fabrication process of a flip-chip light-emitting diode provided in Embodiment 2.

Figure 6:
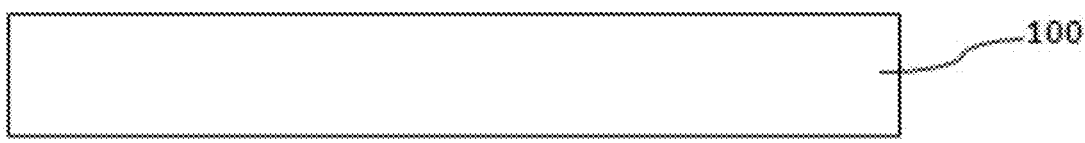
FIG. 6 shows a diagram illustrating the first step in the fabrication process of the flip-chip light-emitting diode provided in Embodiment 2 of the present disclosure.

First, referring to FIG. 6, provide a growth substrate 100. In this embodiment, the growth substrate 100 is sapphire, used for forming an epitaxial substrate for the GaN-based flip-chip light-emitting diode. However, it should be recognized that the growth substrate 100 can be silicon carbide, gallium nitride, silicon or other substrates.

Figure 7:
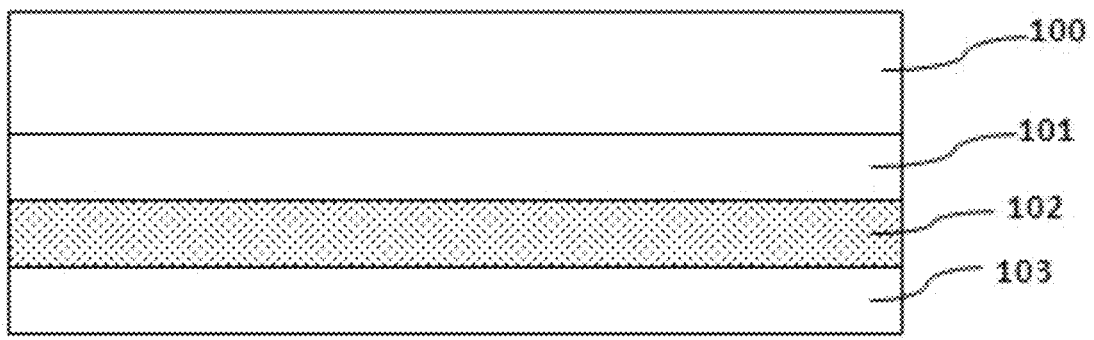
FIG. 7 shows a diagram illustrating the second step in the fabrication process of the flip-chip light-emitting diode provided in Embodiment 2 of the present disclosure.

Second, referring to FIG. 7, grow an epitaxial layer over the growth substrate 100; wherein, the epitaxial layer includes an N-GaN layer 101, a light-emitting layer 102 and a P-GaN layer 103 in successive. In some embodiments, grow a GaN buffer layer over the growth substrate before the growth of the epitaxial layer to get higher lattice quality.

Figure 8:
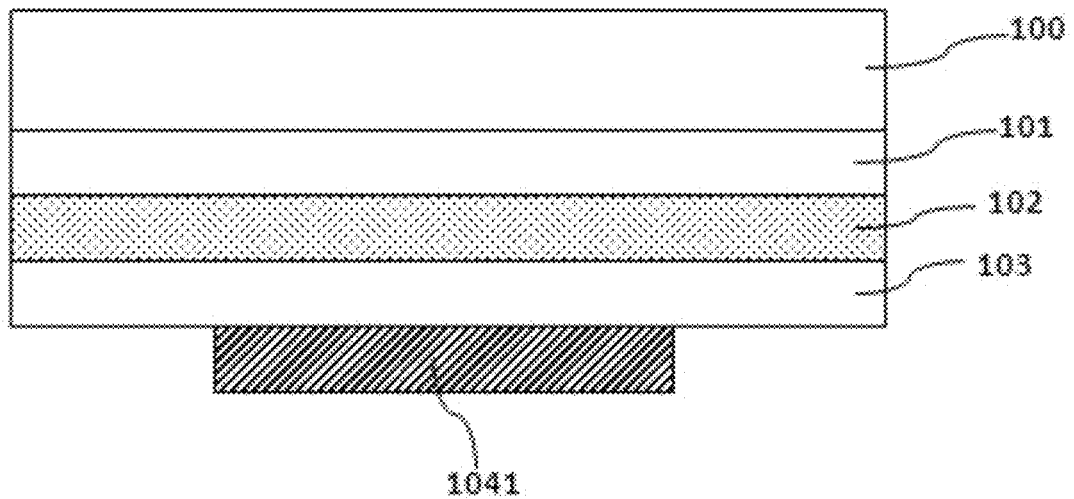
FIG. 8 illustrates a cross-sectional view of the flip-chip light-emitting diode as shown in FIG. 10 along the A-A direction.
Figure 9:
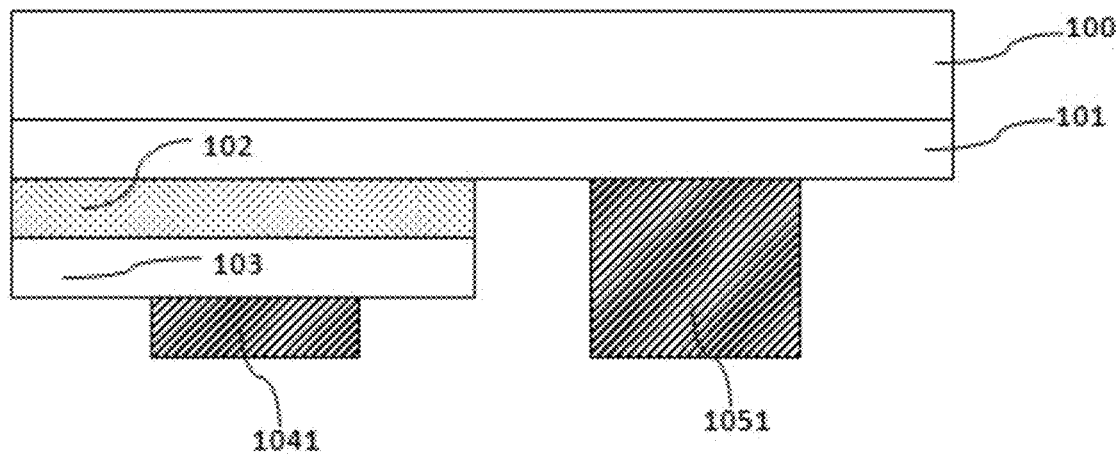
FIG. 9 illustrates a cross-sectional view of the flip-chip light-emitting diode as shown in FIG. 10 along the B-B direction.
Figure 10:
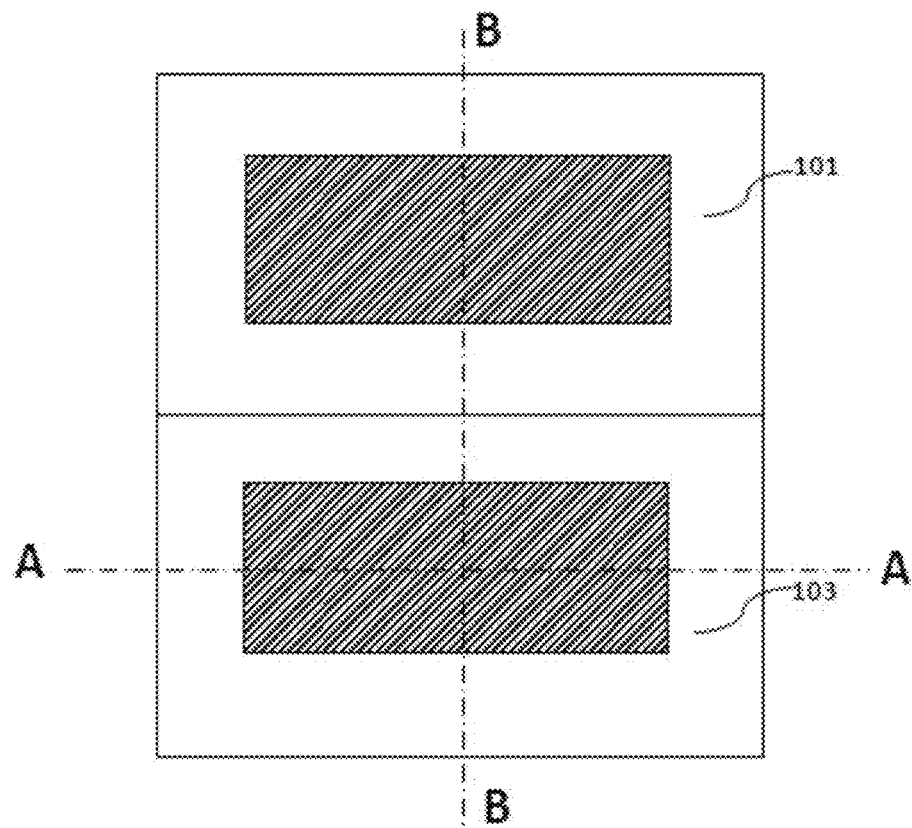
FIG. 10 illustrate a top view of the flip-chip light-emitting diode after the third step in the fabrication process provided in Embodiment 2 of the present disclosure.

Third, referring to FIGS. 8-10, FIG. 8 illustrates a cross-sectional view of the flip-chip light-emitting diode as shown in FIG. 10 along the A-A direction, and FIG. 9 illustrates a cross-sectional view of the flip-chip light-emitting diode as shown in FIG. 10 along the B-B direction. Define chip size via the ICP etching process. Etch from the P-GaN layer 103 of the epitaxial layer downward to the N-GaN layer 101 to expose part of the N-GaN layer 101 surface. Then, form a 1-5 μm P-type electrode body 1041 over the P-GaN layer 103, and form a 1-5 μm N-type electrode body 1051 over the N-GaN layer 101 via yellow light and vapor deposition process.

Figure 11:
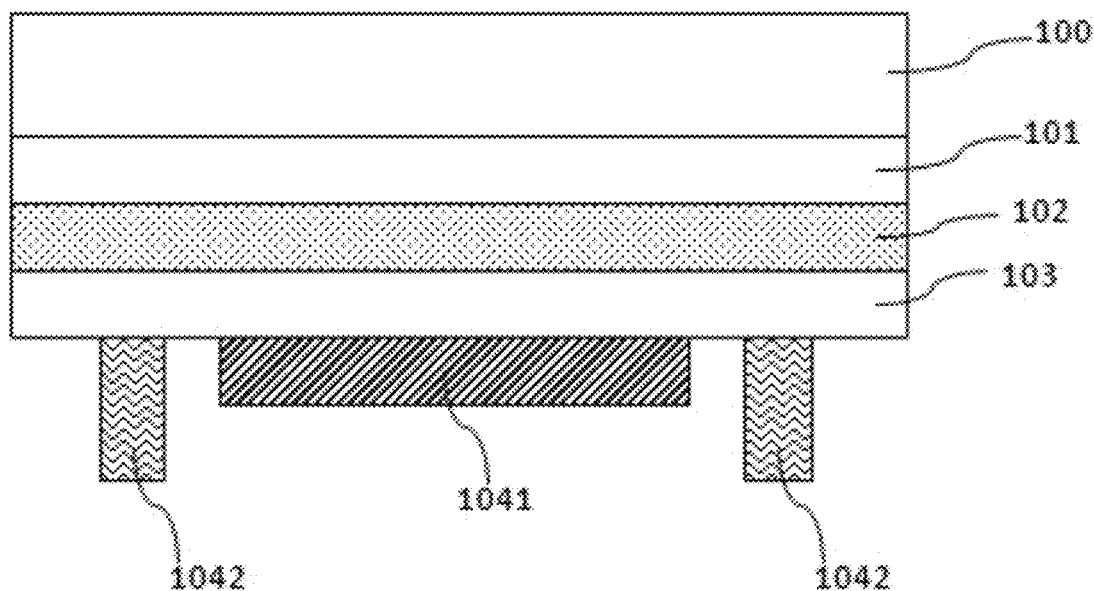
FIG. 11 illustrates a cross-sectional view of the flip-chip light-emitting diode as shown in FIG. 13 along the A-A direction.
Figure 12:
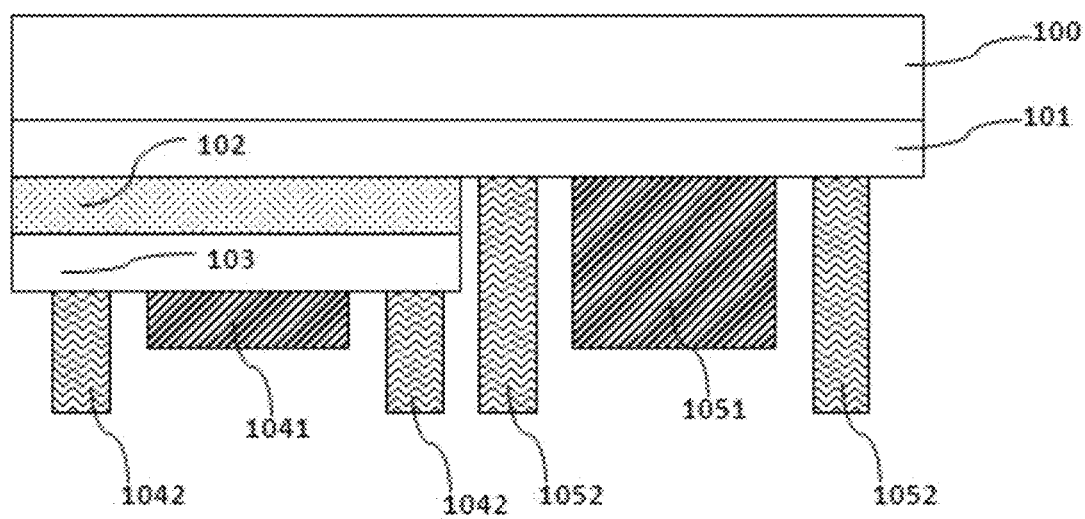
FIG. 12 illustrates a cross-sectional view of the flip-chip light-emitting diode as shown in FIG. 13 along the B-B direction.
Figure 13:
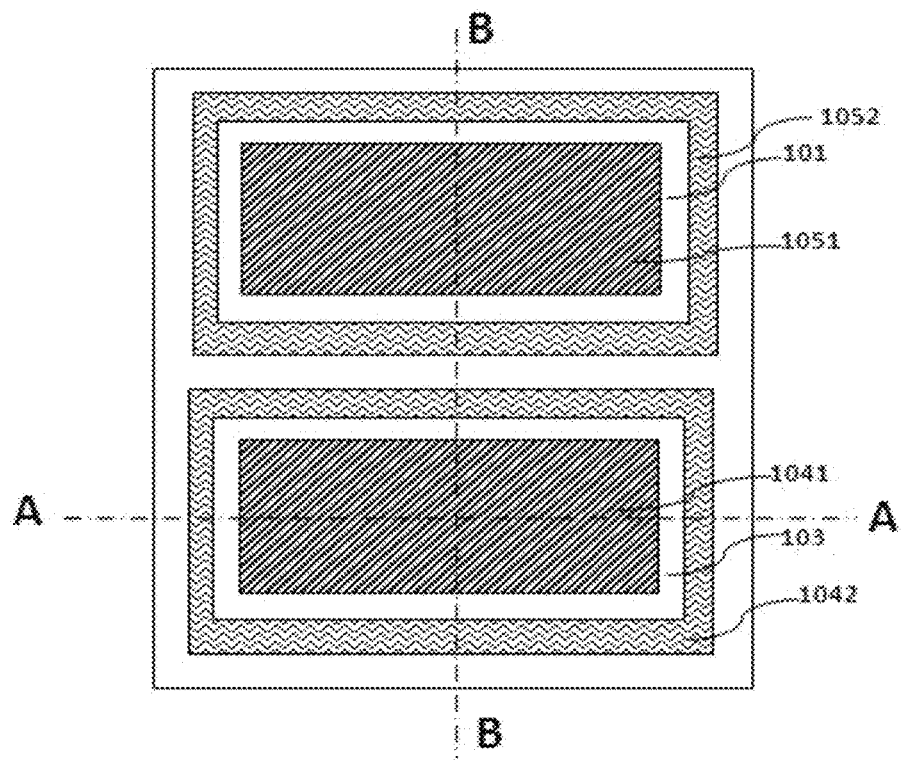
FIG. 13 illustrate a top view of the flip-chip light-emitting diode after the fourth step in the fabrication process provided in Embodiment 2 of the present disclosure.

Fourth, referring to FIGS. 11-13, FIG. 11 illustrates a cross-sectional view of the flip-chip light-emitting diode as shown in FIG. 13 along the A-A direction, and FIG. 12 illustrates a cross-sectional view of the flip-chip light-emitting diode as shown in FIG. 13 along the B-B direction. Again, form a P-type electrode ring 1042 surrounding the P-type electrode body 1041 with a thickness lager than that of the P-type electrode body 1041 over the P-GaN layer 103 via yellow light and vapor deposition process so that the P-type electrode ring 1042 encircles and is spaced from the P-type electrode body 1041; and form an N-type electrode ring 1052 surrounding the N-type electrode body 1051 with a thickness lager than that of the N-type electrode body 1051 over the N-GaN layer 101 so that the N-type electrode ring 1052 encircles and is spaced from the N-type electrode body 1051.

The aforementioned electrode structures can be Ni/Au, Cr/Pt/Au, Ti/Al/Ti/Au or any of their combinations. In this embodiment, Cr/Pt/Au metal material is preferred. As the thickness of the P-type electrode ring 1042 is larger than that of the P-type electrode body 1041, and the thickness of the N-type electrode ring 1052 is larger than that of the N-type electrode body 1051, the P-type electrode ring and the N-type electrode ring function as a barrier wall, which increases the climbing difficulty of solid crystal conductive materials (such as solder paste 109) to avoid short circuit during packaging and usage of the light-emitting diode due to overflow of solder paste, thus improving reliability and yield of the flip-chip light-emitting diode chip.

Embodiment 3

Figure 14:
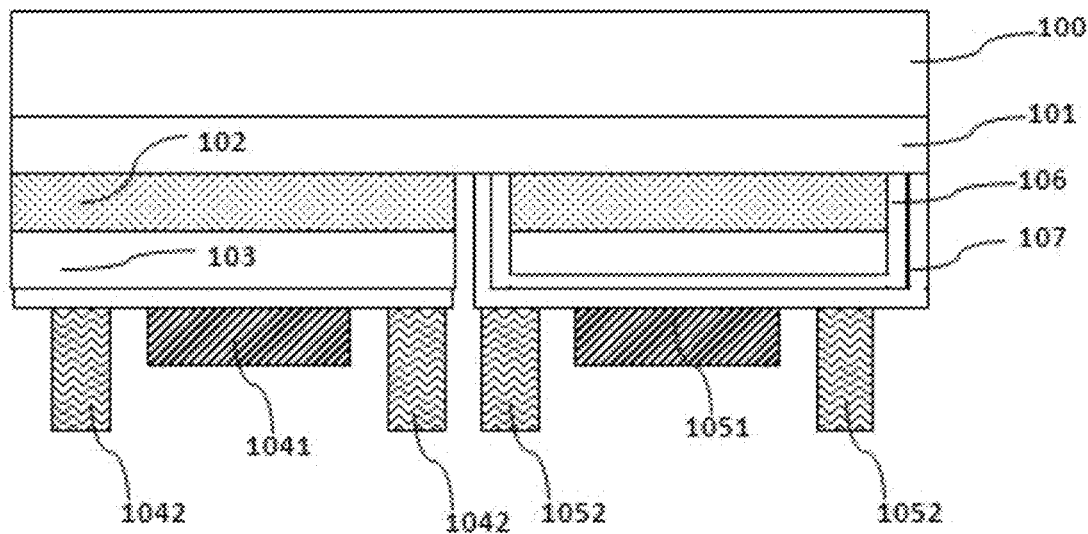
FIG. 14 illustrate a sectional view of the flip-chip light-emitting diode provided in Embodiment 3 of the present disclosure.

The flip-chip light-emitting diode provided in this embodiment, referring to FIG. 14, is different from Embodiment 2 in that the thickness of the first electrode is consistent with (equal height) that of the second electrode for facilitating electrode fabrication. A conductive layer 107 is formed over the epitaxial layer before the first and the second structures are fabricated, wherein, the conductive layer can be an ITO, ZnO, CTO, InO, In-doped ZnO or Al-doped ZnO or Ga-doped ZnO or any of their combinations. In this embodiment, ITO is preferred. It should be noted that an insulating layer 106 may be fabricated between the N-type layer 101 and the conductive layer before the first electrode structures (1051, 1052) form the conductive layer 107.

Embodiment 4

Figure 15:
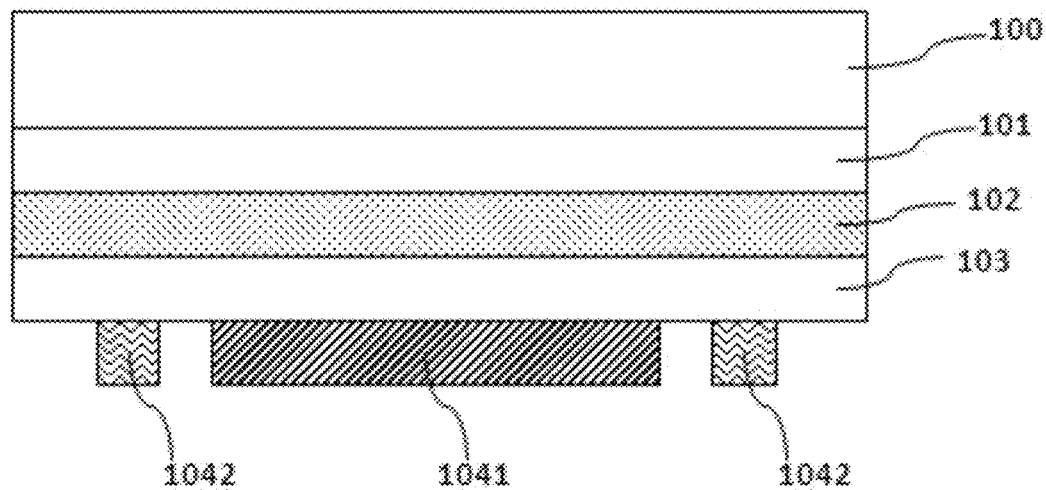
FIG. 15 illustrates a sectional view of the flip-chip light-emitting diode provided in Embodiment 4 of the present disclosure.

The flip-chip light-emitting diode provided in this embodiment, referring to FIG. 15, is different from Embodiment 2 in that the thickness of the P-type electrode ring 1042 is equal to that of the P-type electrode body 1041, and the thickness of the N-type electrode ring 1052 is also equal to that of the N-type electrode body 1051. In this manner, during fabrication of the electrode structure, only one photo and vapor deposition process is required, which effectively cuts fabrication cost and improves productivity.

Embodiment 5

Figure 16:
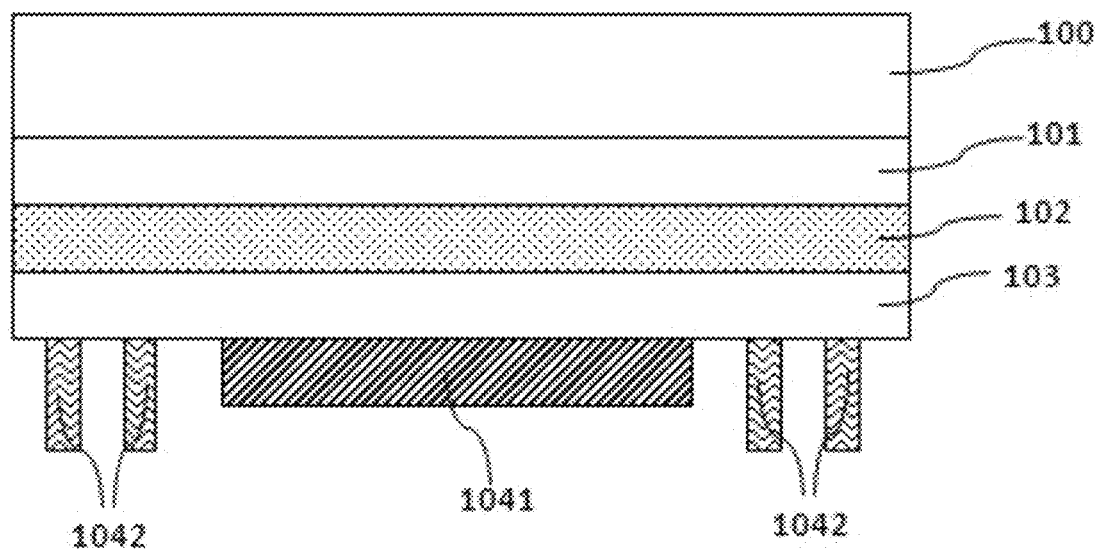
FIG. 16 illustrates a sectional view of the flip-chip light-emitting diode provided in Embodiment 5 of the present disclosure.
Figure 17:
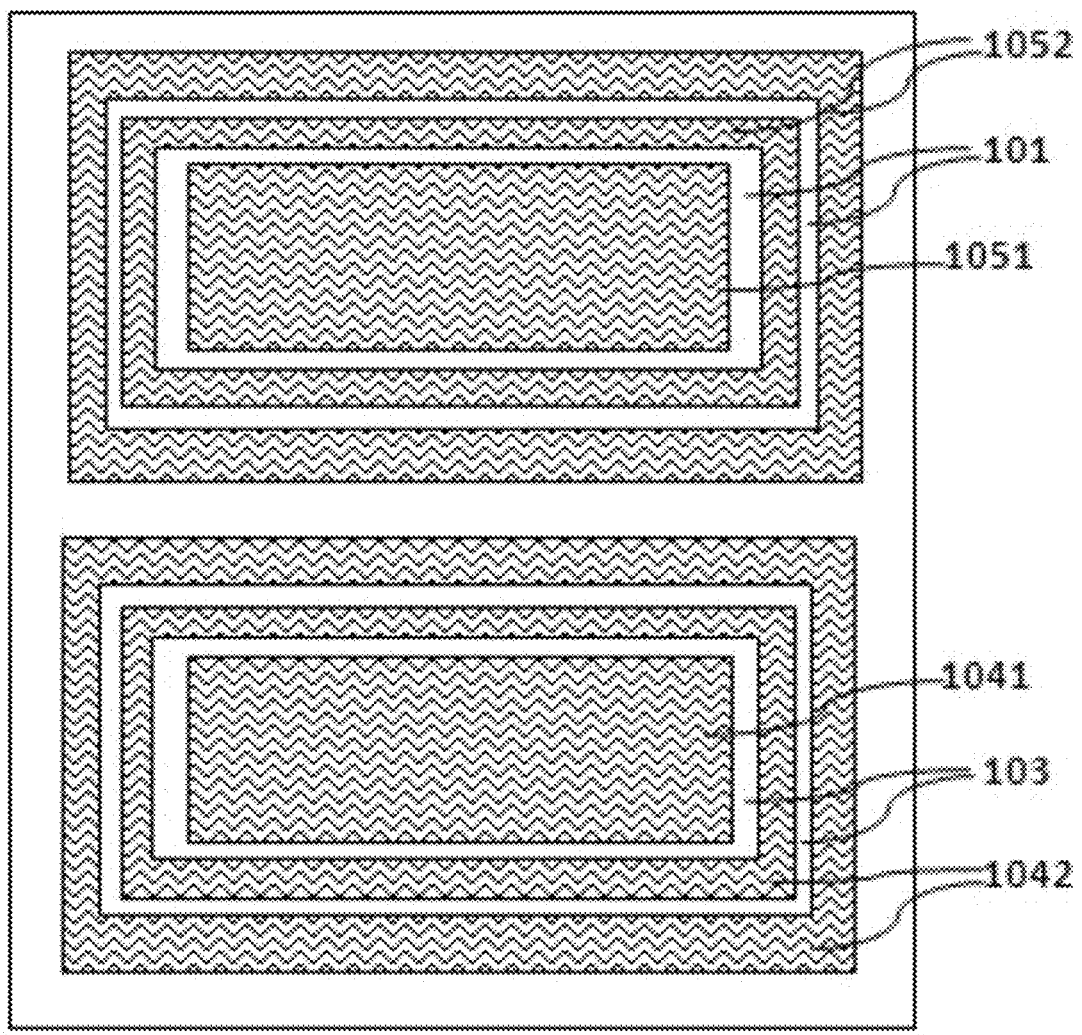
FIG. 17 illustrate a top view of the flip-chip light-emitting diode provided in Embodiment 5 of the present disclosure.

The flip-chip light-emitting diode provided in this embodiment, referring to FIGS. 16 and 17, is different from Embodiment 2 in that the first electrode ring and the second electrode ring at least have one circle; wherein, the inner and outer P-type electrode rings 1042 are of same thickness, and the inner and outer N-type electrode rings 1052 are of same thickness. Preferably, the P-type electrode ring 1042 and the N-type electrode ring 1052 are of same thickness, and both are 60% thicker than the P-type electrode body 1041 and the N-type electrode body 1051. The design of multi-circle electrode ring increases the climbing difficulty of the solid crystal conductive materials, thus improving the reliability of the flip-chip light-emitting diode.

Embodiment 6

Figure 18:
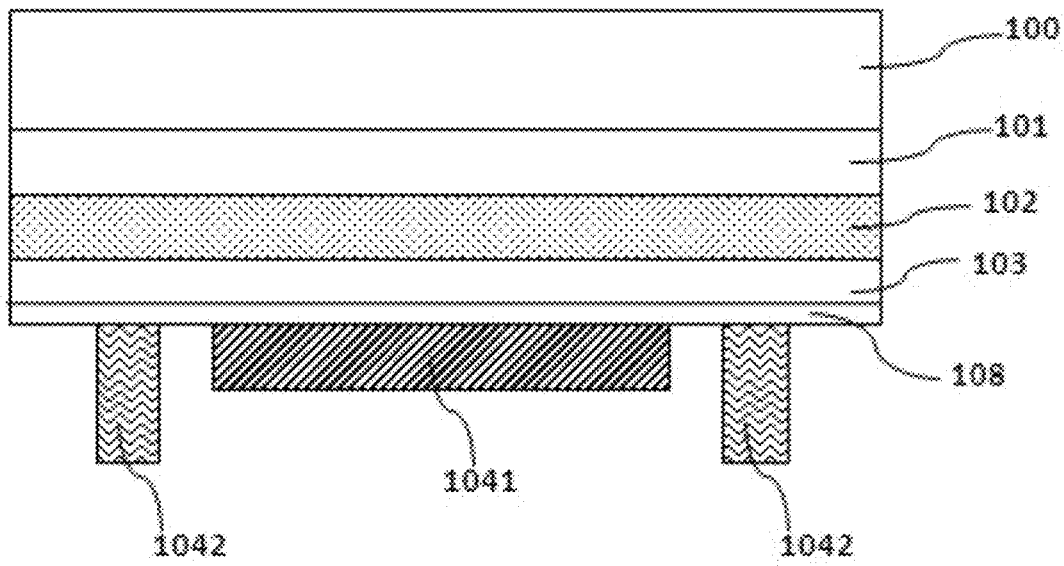
FIG. 18 illustrates a sectional view of the flip-chip light-emitting diode provided in Embodiment 6 of the present disclosure.

The flip-chip light-emitting diode provided in this embodiment, referring to FIG. 18, is different from Embodiment 2 in that a reflective layer 108 is formed over the epitaxial layer before the first and the second electrode structures are fabricated; wherein, the reflective layer 108 can be a single metal layer or a composite metal layer, and the material can be Ag, Al, Ti, Ni or any of their combinations. In this embodiment, an Al/Ti/Ag composite metal layer is preferred to reflect light emitted downwards by the reflective layer, thus improving light-emitting efficiency.

Embodiment 7

Figure 19:
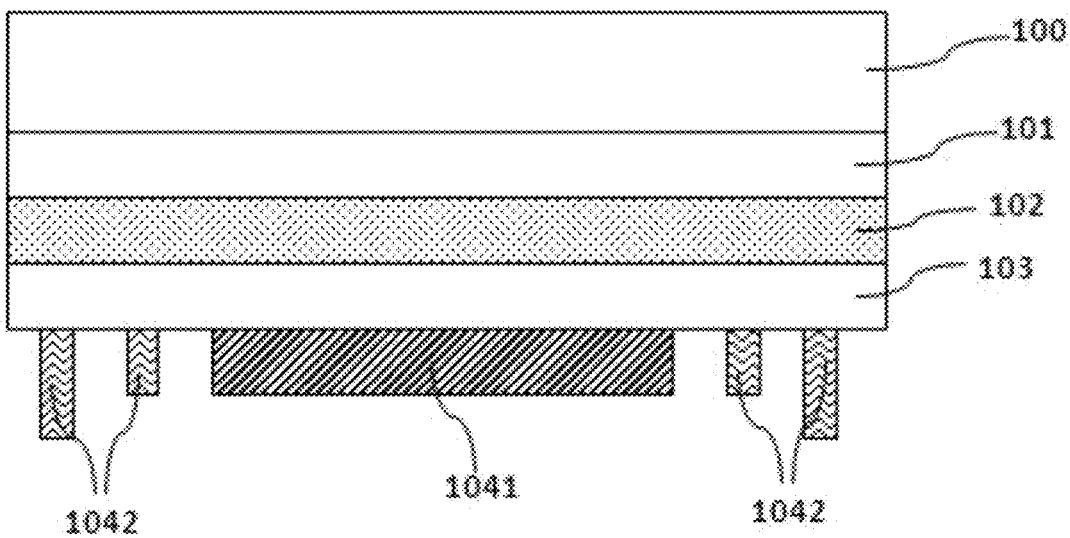
FIG. 19 illustrates a sectional view of the flip-chip light-emitting diode provided in Embodiment 7 of the present disclosure.

The flip-chip light-emitting diode provided in this embodiment, referring to FIG. 19, is different from Embodiment 5 in that the thickness of the inner P-type electrode ring 1042 is smaller than that of the outer P-type electrode ring 1042; correspondingly, the thickness of the inner N-type electrode ring is smaller than that of the outer N-type electrode ring. In addition, the thickness of the inner P-type electrode ring 1042 is equal to that of the P-type electrode body 1041, and thickness of the inner N-type electrode ring is equal to that of the N-type electrode body.

Embodiment 8

Figure 20:
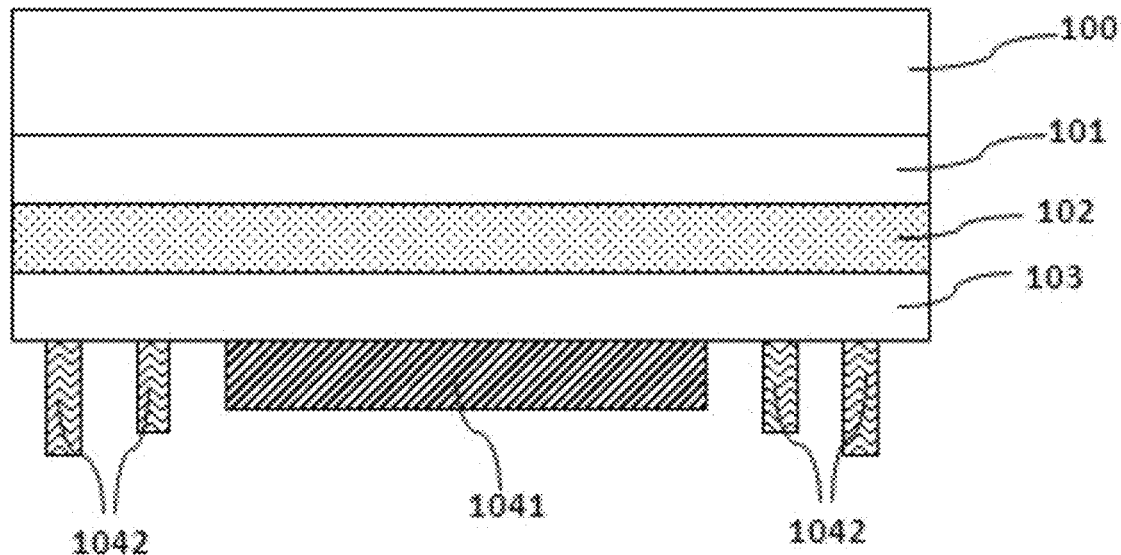
FIG. 20 illustrates a sectional view of the flip-chip light-emitting diode provided in Embodiment 8 of the present disclosure.

The flip-chip light-emitting diode provided in this embodiment, referring to FIG. 20, is different from Embodiment 5 in that the thickness of the P-type electrode body 1041, the inner P-type electrode ring 1042 and the outer P-type electrode ring 1042 increases gradually; and correspondingly, the thickness of the N-type electrode body, the inner N-type electrode ring and the outer N-type electrode ring also increases gradually. As the thickness of the electrode structure gradually increases from the electrode body to the outer electrode ring (the outer electrode ring is thicker than the inner electrode ring), the overflow difficulty of the solid crystal conductive materials is increased from inner ring to outer ring during packaging and usage of the light-emitting diode, thus improving the reliability of the flip-chip light-emitting diode.

Embodiment 9

Figure 21:
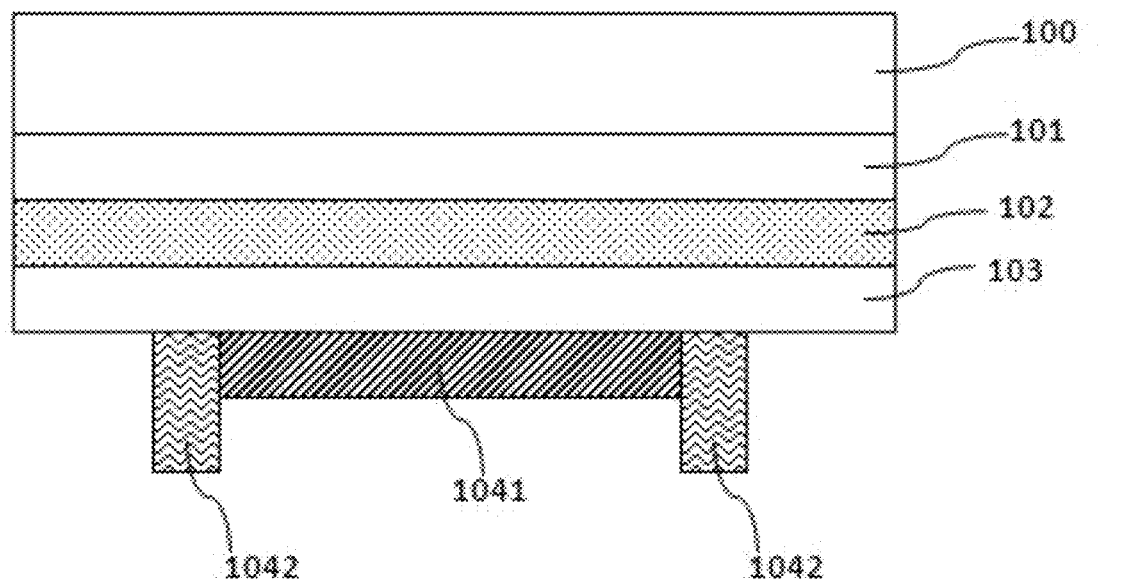
FIG. 21 illustrates a sectional view of the flip-chip light-emitting diode provided in Embodiment 9 of the present disclosure.

The flip-chip light-emitting diode provided in this embodiment, referring to FIG. 21, is different from Embodiment 2 in that the P-type electrode ring 1042 adjoins to the P-type electrode body 1041 with no space between them, and the thickness of the P-type electrode ring 1042 is more than a double of the thickness of the P-type electrode body 1041; similarly, the N-type electrode ring adjoins to the N-type electrode body with no space between them, and the thickness of the N-type electrode ring is more than a double of the thickness of the N-type electrode body. As barrier structures, the P-type electrode ring (thicker than the P-type electrode body) and the N-type electrode ring (thicker than the N-type electrode body) are used for avoiding short circuit during packaging and usage of the light-emitting diode due to overflow of solid crystal conductive materials, thus improving the reliability of the flip-chip light-emitting diode.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A flip-chip light-emitting diode, comprising:
an epitaxial structure, which comprises: a first semiconductor layer, a second semiconductor layer and a light-emitting layer between the first semiconductor layer and the second semiconductor layer;
a first electrode structure over the first semiconductor layer;
a second electrode structure over the second semiconductor layer;
wherein: the first electrode structure comprises a first electrode body and a first electrode ring; the second electrode structure comprises a second electrode body and a second electrode ring; a thickness of the first electrode ring is greater than or equal to a thickness of the first electrode body; and a thickness of the second electrode ring is greater than or equal to a thickness of the second electrode body.

2. The flip-chip light-emitting diode of claim 1, wherein, the first electrode ring encircles the first electrode body and is spaced from the first electrode body; and the second electrode ring encircles the second electrode body and is spaced from the second electrode body.

3. The flip-chip light-emitting diode of claim 1, wherein, each of the first electrode ring and the second electrode ring has at least one circle.

4. The flip-chip light-emitting diode of claim 3, wherein, the inner first electrode ring and the outer first electrode ring are of the same thickness, and the inner second electrode ring and outer second electrode ring are of the same thickness.

5. The flip-chip light-emitting diode of claim 3, wherein, the thickness of the inner first electrode ring is smaller than the thickness of the outer first electrode ring; the thickness of the inner second electrode ring is smaller than the thickness of the outer second electrode ring; the thickness of the inner first electrode ring is equal to the thickness of the first electrode body; and the thickness of the inner second electrode ring is equal to the thickness of the second electrode body.

6. The flip-chip light-emitting diode of claim 3, wherein, the thickness of the first electrode body, the thickness of the inner first electrode ring and the thickness of the outer first electrode ring increases gradually; and the thickness of the first electrode body, the thickness of the inner second electrode ring and the thickness of the outer second electrode ring also increases gradually.

7. The flip-chip light-emitting diode of claim 1, wherein, as barrier structures, the first electrode ring and the second electrode ring are used for avoiding short circuit during packaging and usage of the light-emitting diode due to overflow of solid crystal conductive materials, thus improving the reliability of the light-emitting diode.

8. The flip-chip light-emitting diode of claim 1, wherein, the thickness of the first electrode body is equal to the thickness of the second electrode body for facilitating electrode fabrication.

9. The flip-chip light-emitting diode of claim 1, wherein, the thickness of the first electrode ring is equal to the thickness of the first electrode body, and the thickness of the second electrode ring is also equal to the thickness of the second electrode body.

10. The flip-chip light-emitting diode of claim 1, wherein, the first electrode ring adjoins to the first electrode body with no space between them, and the thickness of the first electrode ring is more than a double of the thickness of the first electrode body; the second electrode ring adjoins to the second electrode body with no space between them, and the thickness of the second electrode ring is more than a double of the thickness of the second electrode body.

11. The flip-chip light-emitting diode of claim 1, wherein, the flip-chip light-emitting diode structure may also comprise a reflective layer or a conductive layer over the epitaxial layer before the first and the second electrode structures are formed.

12. A fabrication method for a flip-chip light-emitting diode structure, comprising:
1) providing an epitaxial structure which comprises: a first semiconductor layer, a second semiconductor layer and a light-emitting layer between the first semiconductor layer and the second semiconductor layer;
2) fabricating a first electrode structure over the first semiconductor layer; wherein, the first electrode structure comprises a first electrode body and a first electrode ring, and a thickness of the first electrode ring is greater than or equal to a thickness of the first electrode body;
3) fabricating a second electrode structure over the second semiconductor layer; wherein, the second electrode structure comprises a second electrode body and a second electrode ring, and a thickness of the second electrode ring is greater than or equal to a thickness of the second electrode body.

13. The fabrication method of claim 12, wherein, the first electrode ring encircles the first electrode body and is spaced from the first electrode body; and the second electrode ring encircles the second electrode body and is spaced from the second electrode body.

14. The fabrication method of claim 12, wherein, each of the first electrode ring and the second electrode ring has at least one circle.

15. The fabrication method of claim 12, wherein, the thickness of the inner first electrode ring is smaller than the thickness of the outer first electrode ring; the thickness of the inner second electrode ring is smaller than the thickness of the outer second electrode ring; the thickness of the inner first electrode ring is equal to the thickness of the first electrode body; and the thickness of the inner second electrode ring is equal to the thickness of the second electrode body.

16. The fabrication method of claim 12, wherein, the thickness of the first electrode body, the thickness of the inner first electrode ring and the thickness of the outer first electrode ring increases gradually; and the thickness of the first electrode body, the thickness of the inner second electrode ring and the thickness of the outer second electrode ring also increases gradually.

17. The fabrication method of claim 12, wherein, as barrier structures, the first electrode ring and the second electrode ring are used for avoiding short circuit during packaging and usage of the light-emitting diode due to overflow of solid crystal conductive materials, thus improving the reliability of the flip-chip light-emitting diode.

18. The fabrication method of claim 12, wherein, the fabrication method may also comprise the fabrication of a reflective layer or a conductive layer over the epitaxial layer before the first and the second electrode structures are fabricated.

19. The fabrication method of claim 12, wherein, the thickness of the first electrode ring is equal to the thickness of the first electrode body, and the thickness of the second electrode ring is also equal to the thickness of the second electrode body.

20. The fabrication method of claim 12, wherein, the first electrode ring adjoins to the first electrode body with no space between them, and the thickness of the first electrode ring is more than a double of the thickness of the first electrode body; the second electrode ring adjoins to the second electrode body with no space between them, and the thickness of the second electrode ring is more than a double of the thickness of the second electrode body.

* * * * *